United States Patent [19]
McCullough et al.

[11] Patent Number: 6,166,172
[45] Date of Patent: Dec. 26, 2000

[54] METHOD OF FORMING POLY-(3-SUBSTITUTED) THIOPHENES

[75] Inventors: Richard D. McCullough; Robert S. Loewe, both of Pittsburgh, Pa.

[73] Assignee: Carnegie Mellon University, Pittsburgh, Pa.

[21] Appl. No.: 09/247,420

[22] Filed: Feb. 10, 1999

[51] Int. Cl.[7] .............................. C08G 75/00; C08F 28/06
[52] U.S. Cl. ........................ 528/380; 528/373; 528/378; 528/379; 524/418; 524/609; 526/256
[58] Field of Search ..................................... 528/380, 373, 528/378, 379; 524/418, 609; 526/256

[56] References Cited

U.S. PATENT DOCUMENTS

| 4,508,639 | 4/1985 | Camps et al. . |
| 4,521,589 | 6/1985 | Yamamoto et al. . |
| 5,358,546 | 10/1994 | Rieke . |
| 5,756,653 | 5/1998 | Rieke . |

OTHER PUBLICATIONS

McCullough, "The Chemistry of Conducting Polythiophenes", *Advanced Materials*, vol. 10, No. 2, pp. 93–116 (1998).
Guillerez et al., "New Convenient Synthesis of Highly Regioregular Poly(3–octylthiophene) Based on the Suzuki Coupling Reaction", *Snythetic Metals*, vol. 93 pp. 123–126, (1998).
Iraqi et al., "Synthesis and Characterisation of Telechelic Regioregular Head–to–Tail Poly(3–Alkylthiophenes)", *Mater. Chem.*, vol. 8, No. 1, pp. 25–29 (1998).
Shirakawa et al., "Cross–Coupling Reaction of Organostannanes with Aryl Halides Catalyzed by Nickel–Triphenylphosphine or Nickel–Lithium Halide Complex", *Synthesis*, pp. 1544–1549 (Oct. 1998).

Boymond et al., "Preparation of Highly Functionalized Grignard Reagents by an Iodine–Magnesium Exchange Reaction and its Application in Solid–Phase Synthesis", *Angew Chem. Int. Ed*, vol. 37, No. 12, pp. 1701–1703 (1998).
Bao et al., "Soluble and Processable Regioregular Poly (3–hexylthiophene) for Thin Film Field–Effect Transistor Applications with High Mobility", *Appl. Phys. Lett.*, vol. 69 (26), pp. 4108–4110 (1996).
Chen et al., "Regiocontrolled Synthesis of Poly(3–alkylthiophenes) Mediated by Rieke Zinc: Their Characterization and Solid–State Properties", *J. Am. Chem Soc.*, vol. 117, pp. 233–244 (1995).
Mao et al., "Synthesis and Structure–Property Relationships of Regioirregular Poly(3–hexylthiophenes)", *Macromolecures*, vol. 26, pp. 1163–1169 (1993).
McCullough et al., "Design, Synthesis, and Control of Conducting Polymer Architectures: Structurally Homogeneous Poly (3–alkylthiophenes)", *J. Org. Chem.*, vol. 58, pp. 904–912 (1993).
Farina et al., "Palladium–Catalyzed Coupling of Arylstannanes with Organic Sulfonates: A Comprehensive Study", *J. Org. Chem.*, vol. 58, pp. 5434–5444 (1993).
Yamamoto et al., "Preparation of π–Conjugated Poly (thiophene–2, 5–diyl), Poly(p–phenylene, and Related Polymers Using Zerovalent Nickel Complexes. Linear Structure and Properties of the π–Conjugated Polymers", *Macromolecules*, vol. 25, pp. 1214–1223 (1992).

*Primary Examiner*—Duc Truong
*Attorney, Agent, or Firm*—Kirkpatrick & Lockhart LLP

[57] ABSTRACT

A method of forming a regioregular polythiophene from a polymerization reaction is described. The method proceeds by combining a soluble thiophene having at least two leaving groups with an organomagnesium reagent to form a regiochemical isomer intermediate, and adding thereto an effective amount of Ni(II) catalyst to initiate the polymerization reaction.

39 Claims, 2 Drawing Sheets

METHOD OF FORMING POLY-(3-SUBSTITUTED) THIOPHENES

STATEMENT REGARDING FEDERALLY SPONSORED RESEARCH OR DEVELOPMENT

This invention was made with government support under NSF Contract CHE-9509959. The United States government may have rights in this invention.

CROSS REFERENCE TO RELATED APPLICATIONS

Not Applicable

BACKGROUND OF THE INVENTION

1. Field of the Invention

The present invention is directed, generally, to a method of forming poly-(3-substituted) thiophenes and, more particularly, to a method of forming head-to-tail coupled regioregular poly-(3-substituted) thiophenes.

2. Description of the Invention Background

Poly-(3-substituted) thiophenes (PTs) represent a class of polymer that are highly processable and exhibit relatively high environmental stability, thermal stability, and electrical conductivity. As a result, these materials have been found to be promising candidates for numerous applications, ranging from electronic and optical devices, such as field-effect transistors, sensors, light-emitting diodes (LEDs), rechargeable batteries, smart cards, and non-linear optical materials, to medical applications, such as artificial muscles. The discovery of additional applications and new technologies is subject, in large part, to molecular designers' ability to control the structure, properties, and function of PTs chemical synthesis. Those in the art have come to recognize that structure plays an important, if not critical role, in determining the physical properties of conducting polymers.

Because of its asymmetrical structure, the polymerization of 3-substituted thiophene produces a mixture of PTs structures containing three possible regiochemical linkages between repeat units. The three orientations available when two thiophene rings are joined are the 2,2', 2,5', and 5,5' couplings. When application as a conducting polymer is desired, the 2,2' (or head-to-head) coupling and the 5,5' (or tail-to-tail) coupling, referred to as regiorandom couplings, are considered to be defects in the polymer structure because they cause a sterically driven twist of thiophene rings that disrupt conjugation, produce an amorphous structure, and prevent ideal solid state packing, thus diminishing electronic and photonic properties. A representation of regiorandom couplings is shown in FIG. 2. The steric crowding of the solubilizing groups in the 3 position leads to loss of planarity and less π overlap. In contrast, the 2,5' (or head-to-tail (HT) coupled) regioregular PTs can access a low energy planar conformation, leading to highly conjugated polymers that provide flat, stacking macromolecular structures that can self-assemble, providing efficient interchain and intrachain conductivity pathways. The electronic and photonic properties of the regioregular materials are maximized. A representation of regioregular coupling is shown in FIG. 1.

Various methods have been employed to synthesize 2,5' regioregular PTs, some of which are described by R. D. McCullough, "The Chemistry of Conducting Polythiophenes", *Advanced Materials*, Vol. 10, No. 2, pages 93–116 (1998), which is incorporated herein by reference in its entirety. The Advanced Materials article describes early and well known methods previously published by R. D. McCullough and R. S. Loewe; (the "McCullough method") and T. A. Chen and R. D. Rieke (the "Rieke method"). More recent approaches to regioregular synthesis are described using chemistry developed by Stille, A. Iraqi and G. W. Barker, *J. Mater. Chem.*, Vol. 8, pages 25–29 (1998), and Suzuki, S. Guillerez and G. Bidan, *G. Synth. Met.*, Vol. 93, pages 123–126, which are incorporated herein by reference. All four methods produce polythiophenes with a high percentage of HT couplings, in the range of 95% or higher.

The McCullough method, developed by one of the applicants of the present invention, synthesizes HT-poly(3-alkylthiophenes) (PATs) at or near about 100% couplings. As illustrated below, this method regiospecifically generates 2-bromo-5-(bromomagnesio)-3-alkylthiophene from a monomer, which is polymerized with catalytic amounts of Ni(dppp)Cl$_2$ (1,3-diphenylphosphinopropane nickel(II) chloride) using Kumada cross-coupling methods. The McCullough method can be illustrated as follows:

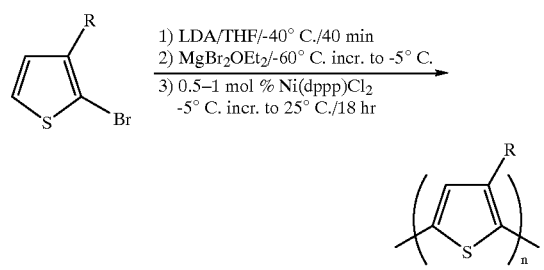

The Rieke method differs from the McCullough method primarily in the synthesis of the asymmetric organometallic intermediate. As illustrated below, a 2,5-dibromo-3-alkylthiophene is added to a solution of highly reactive "Rieke zinc" (Zn*) to form a mixture of the isomers, 2-bromo-3-alkyl-5-(bromozincio) thiophene and 2-(bromozincio)-3-alkyl-5-bromothiophene. The addition of Ni(dppe)Cl$_2$ (1,2-bis(diphenylphosphino)ethane nickel(II) chloride), a nickel cross-coupling catalyst, leads to the formation of a regioregular HT-PATs. The Rieke method can be illustrated as follows:

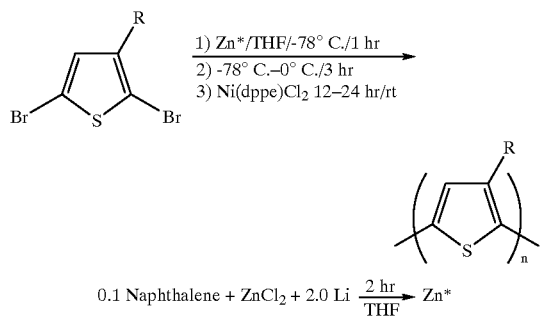

Other methods, such as the Stille and Suzuki methods, use a Pd catalyst rather than a Ni catalyst. The Stille method can be illustrated as follows:

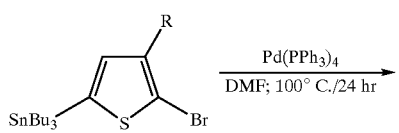

The Suzuki method can be illustrated as follows:

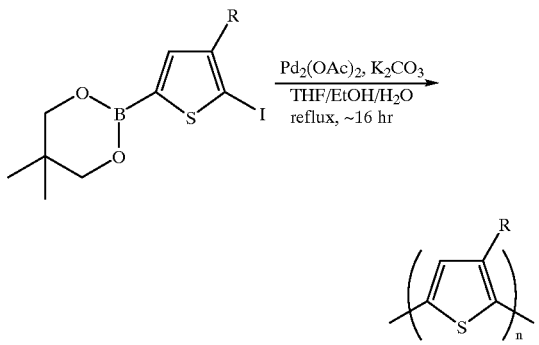

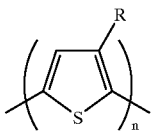

Despite the efforts by those skilled in the art to improve HT coupling techniques, the synthetic procedures heretofore described have significant drawbacks. For example, the McCullough method requires highly purified starting materials, the most important of which is the monomer, 2-bromo-3-alkylthiophene. The need for purity adds to the cost of the synthesis. The Rieke method includes the easy to purify 2,5-dibromo-3-alkylthiophene as the starting material (because the compound is the highest boiling fraction in the crude mixture in its preparation), but requires the non-trivial preparation of Rieke zinc via alkali metal reduction of zinc halides in an inert environment. The Rieke zinc is very difficult to produce and, therefore, very costly. Both the Stille and Suzuki methods require an extra processing step in their synthesis, thereby decreasing their manufacturing efficiency and flexibility. All of the above illustrated synthesis reactions require cryogenic temperatures at some point during the synthesis, and long polymerization times of 12 to 24 hours or longer. In addition, there have been no reports that any of these known methods have been used for the large scale synthesis of HT-PTs.

Accordingly, a new method for the preparation of HT-poly-(3-alkylthiophenes) is needed that is efficient, and economical, provides greater manufacturing flexibility, and is suited for use in large scale industrial processes.

BRIEF SUMMARY OF THE INVENTION

The present invention solves the above-mentioned problems by providing a new method of forming a polymer. The method includes combining a soluble thiophene having at least two leaving groups with an organomagnesium reagent to form a regiochemical isomer intermediate, and adding thereto an effective amount of Ni(II) catalyst to initiate a polymerization reaction. The reaction yields major amounts of a soluble regioregular polythiophene. The soluble thiophene is preferably a dihalothiophene having a solubilizing substituent thereon.

The soluble thiophene most preferably is a 2,5 dihalo-substituted thiophene having the structure:

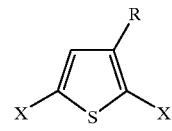

wherein X may be any halogen, but is preferably Br or I, and R is any non-reactive or protected reactive substituent that is non-reactive with the organomagnesium reagent, such as an alkyl or an ether group.

The isomer intermediate thus may have the structure:

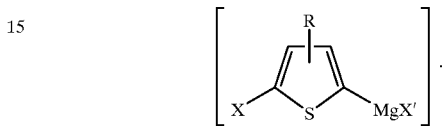

In a preferred embodiment, the present invention provides a method for the large scale preparation of poly-(3-alkylthiophenes) using a 3-substituted thiophene having at least two leaving groups as a starting material. The thiophene starting material is dissolved in a solvent to form a mixture. An organomagnesium reagent is added to the mixture to form a solution. The solution is heated to reflux, and a regiochemical isomer intermediate is formed. A Ni(II) catalyst is added. Following the addition of the catalyst, the solution is stirred at reflux and the reaction is allowed to proceed for a period of time suitable for polymerizing the desired polythiophene product. Thereafter, the product is recovered. If needed, additional reflux time may be provided. The reaction may be quenched prior to recovery of the regioregular poly-(3-alkyl)thiophene.

The present invention solves problems experienced with the prior art because it offers a method for the production of poly-(substituted)thiophenes that can be carried out in substantially less time at a significantly lower cost than prior art methods. The method of the invention does not require the use of cryogenic temperatures like other prior art methods and preferentially yields relatively major amounts of the desired polymer product, making this method well suited for use on an industrial scale.

Those and other advantages and benefits of the present invention will become apparent from the description of the preferred embodiments hereinbelow.

BRIEF DESCRIPTION OF THE SEVERAL VIEWS OF THE DRAWING

The characteristics and advantages of the present invention may be better understood by reference to the accompanying drawings, in which.

DETAILED DESCRIPTION OF THE INVENTION

Figure 1:
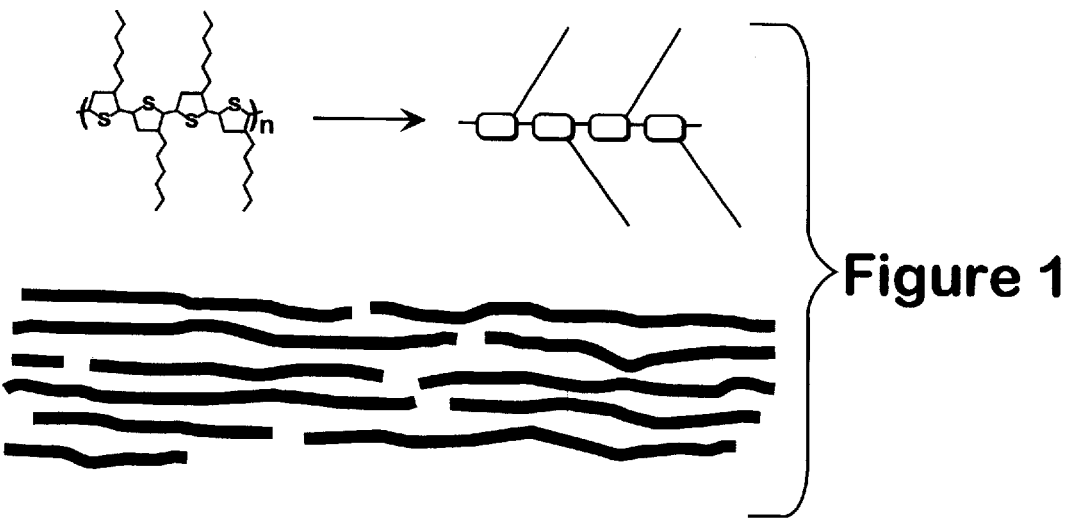
FIG. 1 is a schematic view of a regioregular polythiophene.

The present invention is a method for producing regioregular polythiophenes. A dihalo thiophene monomer bearing a substituent R to promote solubility is reacted with an organomagnesium reagent in the presence of a solvent for a period of time sufficient to produce a regiochemical mixture of isomers. A polymerization catalyst is added and the reaction proceeds for a period of time sufficient to produce the desired yield of regioregular polythiophenes. The polythiophene product includes major amounts of regioregular thiophene couplings and minor amounts of regiorandom thiophene couplings.

The new synthesis for preparing HT-PATs proceeds as follows:

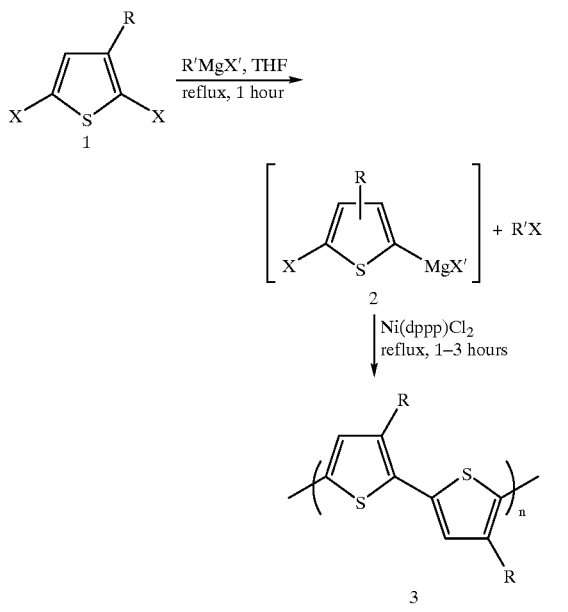

wherein X may be any halogen, such as Br or I, and R may be any non-reactive or protected reactive substituent that is non-reactive with the organomagnesium Grignard reagent (R'MgX'). R is preferably an alkyl or an ether group and most preferably an alkyl or substituted alkyl. The organomagnesium reagent (R'MgX') may be any Grignard reagent. X' may be any halogen, but is typically Br or Cl, and $R^1$ is typically any alkyl, vinyl, or phenyl group. Examples include, without limitation, $CH_3$—$CH$=$CH_2$, —$C_3H_7$,— $C_6H_{13}$, $C_{12}H_{25}$, isopropyl and tert-butyl groups.

The Grignard metathesis reactions are well known in the art, an example of which is described by L. Boymond, M. Rottländer, G. Cahiez, and P. Knochel, *Angew. Chem. Int. Ed., Communications*, 1998, 37, No.12, pages 1701–1703, which is incorporated herein by reference in its entirety. If R in compound (1) is reactive with the organomagnesium reagent, a protective group should be coupled with the R-group to prevent the R-group from taking part in the synthesis. The use of protective groups with a reactive R-group is well known in the art, as described by Greene and Greene, "Protective Groups in Organic Synthesis," John Wiley and Sons, New York (1981), which is incorporated herein by reference.

Compound (1) may be various purified thiophene monomer starting materials, such as a substituted thiophene having two leaving groups, such as a dihalo 3-substituted thiophene. For example, a compound (1) that is greater than 99% pure gives the highest molecular weight yields. Purified 2,5-dibromo-3-dodecylthiophene is one example, but any halogen and any nonreactive substituent may be used that adds solubility. The leaving groups may be any halogens, such as Br or I. The purified compound (1) may be formed as part of the present process, or may be purchased from a commercially available supplier. For example, when 2,5-dibromo-3-dodecylthiophene is chosen as the starting material, it may be purified, for example, as described in Example 1, below, or it may be purchased from Aldrich Chemical, Milwaukee, Wis. Bromine is preferred over iodine as the leaving group in the starting monomer because the iodine compound substantially increases the toxicity of the reaction. It is believed that chlorine may also be used.

Compound (1) may be reacted with about one equivalent of an organomagnesium (Grignard) reagent, in refluxing solvent, for a sufficient period to time, about one hour, to produce intermediate regiochemical isomer (2) (as a mixture of regiochemical isomers).

Any refluxing anhydrous solvent (dry solvent) may be employed in the formation of the intermediate isomer (2), such as tetrahydrofuran (THF). THF is commercially available from Fisher Scientific, Pittsburgh, Pa. Formation of the intermediate isomer (2) should be performed at temperatures at or below the boiling point of the refluxing solvent, and can be performed at room temperature (25° C.). For example, when THF is employed, the reaction should be performed at its boiling point temperature (66° C.).

The intermediate regiochemical isomer (2) is typically a mixture of regiochemical isomers. For example, it has been observed that the intermediate isomer (2) may be a combination of:

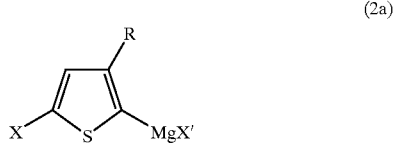

(2a)

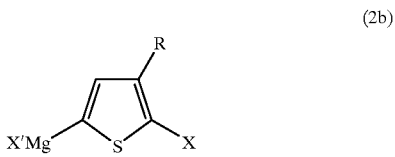

(2b)

where (2a) and (2b) are present in either major or minor amounts depending on the choice of R-group. For example, when R is alkyl, the yield for (2a) is about 10–20% and the yield for (2b) is about 80–90%. When R is an ether, particularly a long chain ether, the yield for (2a) is about 60–85% and for (2b) is about 15–40%.

The intermediate isomer (2) may be treated with a Ni(II) catalyst, such as, for example, Ni(dppp)Cl$_2$ or Ni(dppe)Cl$_2$ to complete the reaction. When Ni(dppp)Cl$_2$ is employed, the catalyst may be added in the range of about 0.2–1.0 mol%. The addition of the Ni(II) catalyst may be carried out at temperatures ranging from 0–67° C., but is typically performed at room temperature or reflux temperature. The solution may be refluxed for a sufficient period of time, about 45 minutes to three hours or more, to produce the desired polymer. The yield of the CHCl$_3$ soluble fraction is 60–70% in three hours. The recovered polymer has 95–99% HT—HT couplings, as shown by $^1$H NMR. The polymer is also exceptionally pure as shown by elemental analysis.

It is possible to employ the large scale preparation of HT-PTs using the method of the present invention. For example, when 13 grams of 2,5-dibromo-3-dodecylthiophene (1) was polymerized in three hours, 4 grams of pure HT-PDDT was produced. All of the resultant polymers have reasonable molecular weights and low polydispersities, and have about 95–99% HT—HT couplings. For example, when R is dodecyl, $M_n$=18–35K, polydispersity index=1.20–1.67, when R is hexyl, $M_n$=13–30K, polydispersity index=1.13–1.55.

In addition, thiophene monomers bearing polyether side chains can be polymerized by the method of the present invention with somewhat reduced yields.

It is contemplated that the above method may be manipulated so that, for example, shorter reaction times may be employed that produce a lower product yield. For example, as illustrated below in Example 3, when employing 2,5-dibromo-3-dodecylthiophene as the starting material, a 40 minute reaction time yields about 40% HT-PDDT.

Figure 2:
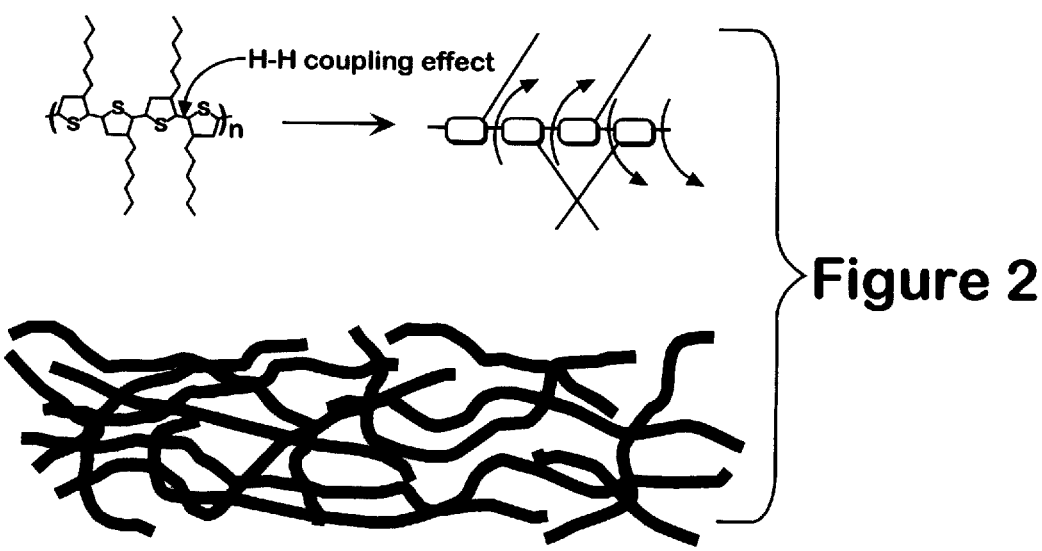
FIG. 2 is a schematic view of a regiorandom polythiophene.
Figure 3:
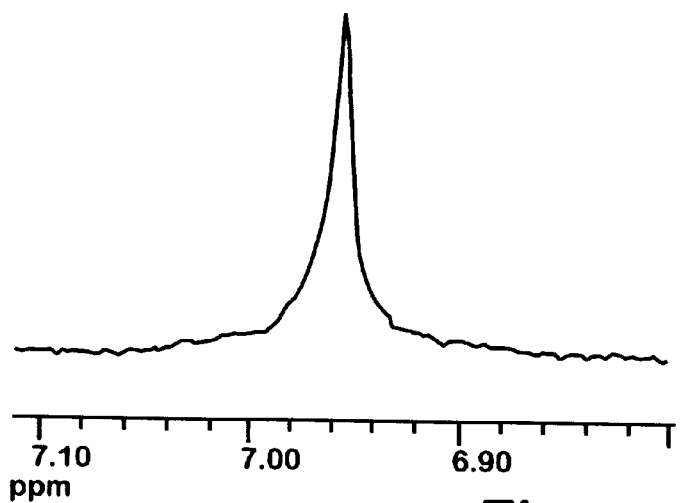
FIG. 3 is a $^1$H NMR taken in the aromatic region of HT-poly-3(dodecylthiophene) synthesized using the method of the present invention.
Figure 4:
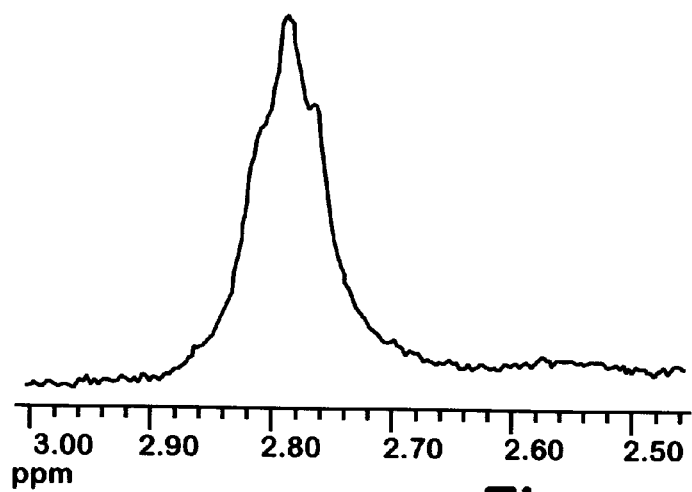
FIG. 4 is a $^1$H NMR taken in the methylene region of HT-poly-3(dodecylthiophene) synthesized using the method of the present invention.
Figure 5:
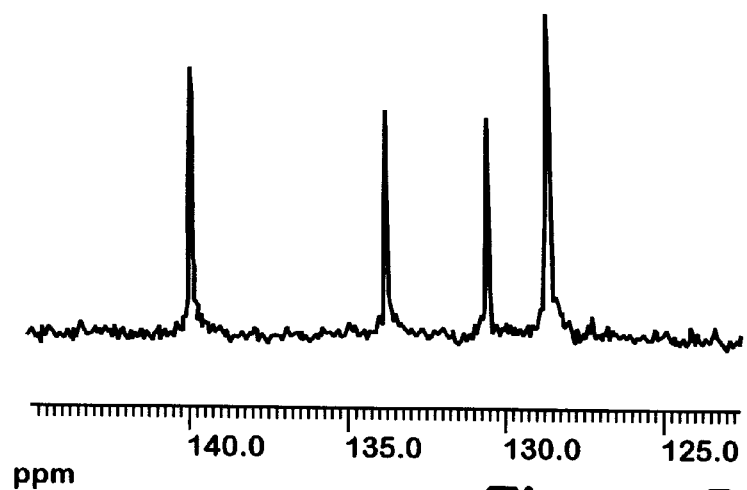
FIG. 5 is a $^{13}$C NMR taken in the aromatic region of HT-poly-3(dodecylthiophene) synthesized using the method of the present invention.

As illustrated in FIGS. 1–3, the HT-PDDT yield prepared using the method of the present invention is substantially identical to HT-PDDT yield prepared by other prior art methods, as shown by using $^1$H and $^{13}$C NMR to determine the regioregularity of PATs. FIGS. 3–5 show both the $^1$H and $^{13}$C NMR spectra of HT-PDDT. The high degree of regioregularity can be seen by the appearance of only one singlet in the aromatic region (FIG. 3) as well as a clean triplet in the methylene region of the proton NMR (FIG. 4). As illustrated in FIG. 5, carbon NMR shows only four distinct thiophene carbon resonances. The solid state UV-vis spectra (films cast from 1,1,2,2-tetrachloroethane) of this material is typical of HT-PDDT with a $\lambda_{max}$ of 569 nm with shoulders at 528 and 620 nm. The band edge occurs at 710 nm. Solution UV-vis (CHCl$_3$) shows a $\lambda_{max}$ of 459 nm.

While the regioselectivity of the metathesis reaction (80:20 mixture of isomers) is high, there is still an even higher degree of regioselectivity displayed in the resulting polymer (99% HT—HT), due to catalyst selectivity. For example, catalyst selectivities of up to 20:1 have also been noted in some couplings of isomers, V. Farina, B. Krishnan, D. R. Marshall, and G. P. Roth, *J. Org. Chem.* Vol 58, No. 20, pages 5434–5444 (1993), which is incorporated herein by reference in its entirety.

The following examples are for illustration only and are not meant to limit the scope of the appended claims.

EXAMPLE 1

2,5-dibromo-3-dodecylthiophene (1) was prepared by dissolving 3-dodecylthiophene (19.41 g, 77.06 mmol) in 100 mL of THF. N-Bromosuccinimide (27.43 g, 154 mmol) was added to the solution over a period of 5 minutes. The solution was stirred at room temperature for 2 hours. The solvent was removed in vacuo and 250 mL of hexane was added to precipitate substantially all of the succinimide. The mixture was filtered through a plug of silica to remove the succinimide and the solvent was removed in vacuo. A Kugelrohr distillation (120° C., 0.02 T) yielded 2,5-dibromo-3-dodecylthiophene (1) (26.26 g, 83.3%) (the highest boiling fraction) as a clear, colorless oil. $^1$H NMR (CDCl$_3$): δ 6.76 (s, 1H), 2.49 (t, 2H), 1.52 (m, 2H), 1.25 (m, 18H), 0.87 (t,3H). $^{13}$C NMR (CDCl$_3$) 143.0, 130.9, 110.3, 107.9, 31.9, 29.7, 29.6, 29.4, 29.1, 25.4, 22.7, 14.1. (Calcd. for C$_{16}$H$_{26}$Br$_2$S:C=46.84, H=6.39, Br=38.95; Found C=46.51, H=6.47, Br=38.69).

The 2,5-dibromo-3-dodecylthiophene (1.28 g, 3.12 mmol) (1) is dissolved in 18 mL of THF. CH$_3$MgBr (3.15 mL, 1.0 M solution in butyl ether) is added and the mixture was heated to reflux for one hour. The catalyst, Ni(dppp)Cl$_2$ (16.9 mg, 1 mol %) was added and the solution was stirred at reflux for 2 hours. The mixture was poured over 150 mL of methanol and filtered into a Soxhlet thimble. Soxhlet extractions were performed with methanol (to remove catalyst, monomer and salts), hexanes (to remove oligomers), and chloroform. The chloroform layer was rotovapped to give a violet film and pumped on for several hours affording 0.510 g (65% yield) of HT-PDDT (3). $^1$H NMR (CDCl$_3$): δ 6.96 (s, 1H), 2.79 (t, 2H), 1.69 (m, 2H), 1.25 (m, 18H), 0.86 (t, 3H). $^{13}$C NMR (CDCl$_3$): δ 139.89, 133.74, 130,52, 128.61, 31.94, 30.56, 29.69, 29.53, 29.38, 22.70, 14.10. (Calcd. for (C$_{16}$H$_{26}$S)$_n$: C=76.79%, H=10.47%; Found C=76.41%, H=10.43%).

EXAMPLE 2

The method of the present invention may be used for the large scale preparation of HT-PDDT (3). The procedure is similar to what has been described in Example 1, above, with 2,5-dibromo-3-dodecylthiophene (1) (13.9 g, 33.8 mmol), 250 ml of THF, and 34 ml of CH$_3$MgBr (1.0 M solution in butyl ether) being refluxed for 50 min, followed by the addition of 196 mg of Ni(dppp)Cl$_2$. After refluxing the mixture for another 1 hour and 20 minutes, the reaction was quenched by pouring the reaction mixture into 1.4 L of MeOH. This procedure yielded 40% (3.4 g) of pure HT-PDDT.

EXAMPLE 3

The method of the present invention may be used for the short preparation time of HT-PDDT. The procedure is similar to the previous examples described above, with 2,5-dibromo-3-dodecylthiophene (1) (1.8 g, 4.4 mmol), 25 ml of THF, and 4.4 ml of CH$_3$MgBr (1.0M solution in butyl ether) being refluxed for 20 minutes, followed by the addition of 12 mg of Ni(dppp)Cl$_2$. After refluxing the mixture for another 20 minutes, the reaction was quenched by pouring the reaction mixture into 100 mL of MeOH. Extraction yielded 40% (420 mg) of pure HT-PDDT.

The following illustration confirms the presence of a Grignard metathesis. A compound (1) was treated with a variety of Grignard reagents (R'MgX') and quenched with trimethylsilyl chloride (TMS-Cl). The reaction is illustrated as:

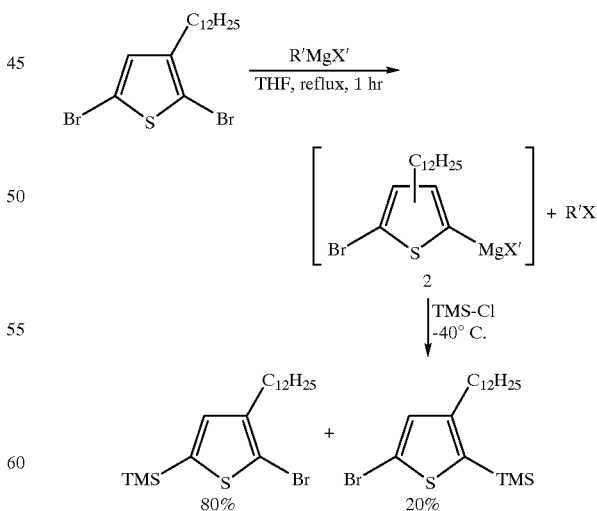

The quenching results strongly suggests the presence of a magnesium-bromine exchange reaction. Surprisingly, this exchange occurred with a large degree of regiocontrol (80:20 distribution of isomers).

The regiochemical polymerization method of the present invention provides many advantages over the prior art syntheses. Preparation and purification of the thiophene monomers offer a time-effective method over the prior art, as no more than two reaction steps are required from readily available starting materials. In addition, the corresponding Grignard reagents are cost effective and easy to handle. The method of the present invention does not require the use of cryogenic temperatures like other prior art methods and has been shown to yield relatively large amounts of the desired product, making this method particularly well suited for industrial scale applications. High yield regioregular, HT-poly-(3-alkylthiophenes) are produced in short reaction times without the need for expensive $MgBr_2$ and $ZnCl_2$ reagents heretofore required. In addition, there is a high degree of regiocontrol displayed in the Grignard metathesis step.

The regioregular polymers produced by the method of the present invention are useful in a number of commercially important applications. Examples include light emitting diodes (LEDs), field-effect transistors, flat panel displays, smart cards, chemical sensory materials, nonlinear optical materials and microwave absorbing materials for use in stealth technology.

Although the foregoing description has necessarily presented a limited number of embodiments of the invention, those of ordinary skill in the relevant art will appreciate that various changes in the components, details, materials, and process parameters of the examples that have been herein described and illustrated in order to explain the nature of the invention may be made by those skilled in the art, and all such modifications will remain within the principle and scope of the invention as expressed herein in the appended claims. For example, particular detail directed to the use of 2,5-dibromo-3-dodecylthiophene as a starting material has been presented. It should be understood by those skilled in the art that the use of 2,5-dibromo-3-dodecylthiophene in the above examples is illustrative only, and that other starting materials may be employed to yield HT-poly-(3-substituted) thiophenes. All such additional applications of the invention remain within the principle and scope of the invention as embodied in the appended claims.

What is claimed is:

1. A method of forming poly-(3-substituted) thiophene, comprising:
   providing a soluble thiophene having at least two leaving groups;
   dissolving the soluble thiophene in a solvent to form a mixture;
   adding an organomagnesium reagent to the mixture;
   heating the solution to reflux to form a solution containing a regiochemical isomer intermediate;
   adding a Ni(II) catalyst to the solution;
   agitating the solution; and
   recovering the poly-(3-substituted) thiophene.

2. The method of claim 1 wherein the soluble thiophene is 2,5-dibromo-3-dodecylthiophene.

3. The method of claim 1 wherein the solvent is tetrahydrofuran.

4. The method of claim 1 wherein the organomagnesium reagent is methylnagnesium bromide.

5. The method of claim 1 wherein said heating the solution to reflux occurs for about one hour.

6. The method of claim 1 wherein the Ni(II) catalyst is one of 1,3-diphenylphosphinopropane nickel(II) chloride and 1,2-bis(diphenylphosphino)ethane nickel(II) chloride.

7. The method of claim 1 wherein said agitating the solution occurs at reflux for about two hours.

8. The method of claim 1 wherein said recovering the poly-(3-substituted) thiophene includes pouring the solution over methanol, hexanes, and chloroform.

9. A method of forming a poly-(3-substituted) thiophene, comprising:
   providing a soluble thiophene having at least two leaving groups;
   dissolving the soluble thiophene in a solvent to form a mixture;
   adding an organomagnesium reagent to the mixture;
   heating the solution to a first reflux to form a solution containing a regiochemical isomer intermediate;
   adding a Ni(II) catalyst to the solution to initiate a polymerization reaction;
   heating the solution to a second reflux; and
   quenching the reaction and recovering the poly-(3-substituted) thiophene.

10. The method of claim 9 wherein the soluble thiophene is 2,5-dibromo-3-dodecylthiophene.

11. The method of claim 9 wherein the solvent is tetrahydrofuran.

12. The method of claim 9 wherein the organomagnesium reagent is methylmagnesium bromide.

13. The method of claim 9 wherein the Ni(II) catalyst is one of 1,3-diphenylphosphinopropane nickel(II) chloride and 1,2-bis(diphenylphosphino)ethane nickel(II) chloride.

14. The method of claim 9 wherein said quenching is performed by pouring the solution into MeOH.

15. An electrically conductive or optically sensitive polymeric material formed from a process, comprising:
   combining a soluble thiophene having at least two leaving groups with an organomagnesium reagent to form a regiochemical isomer intermediate;
   adding an effective amount of a Ni(II) catalyst to initiate a polymerization reaction; and
   permitting the reaction to proceed for a period of time sufficient to produce major amounts of regioregular polythiophene.

16. A method of forming a polymer, comprising:
   combining a soluble thiophene having at least two leaving groups with an organomagnesium reagent to form a regiochemical isomer intermediate, wherein said organomagnesium reagent has the formula R'MgX' and R' is a substituent selected from the group consisting of alkyl, vinyl and phenyl and X' is a halogen; and
   adding an effective amount of a Ni(II) catalyst to initiate a polymerization reaction.

17. The method of claim 16 wherein said soluble thiophene has the structure:

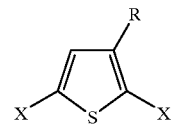

wherein R is one of an non-reactive and protected reactive substituent that is non-reactive with said organomagnesium reagent, and X is a halogen.

18. The method of claim 17 wherein X is a halogen selected from the group consisting of Br and I.

19. The method of claim 17 wherein R is a substituent selected from the group consisting of alkyl and ether.

20. The method of claim 16 wherein said isomer intermediate has the structure:

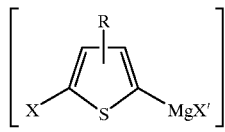

wherein R is one of an non-reactive and protected reactive substituent that is non-reactive with said organomagnesium reagent, X is a halogen, and X' is a halogen.

21. The method of claim 20 wherein X is a halogen selected from the group consisting of Br and I.

22. The method of claim 20 wherein X' is a halogen selected from the group consisting of Br and I.

23. The method of claim 20 wherein R is a substituent selected from the group consisting of alkyl and ether.

24. The method of claim 23 wherein R and R' are each an alkyl group.

25. The method of claim 23 wherein said organomagnesium reagent is methylmagnesium bromide.

26. The method of claim 16 wherein said Ni(II) catalyst is one of 1,3-diphenylphosphinopropane nickel(II) chloride and 1,2-bis(diphenylphosphino)ethane nickel(II) chloride.

27. The method of claim 16 wherein said soluble thiophene is 2,5-dibromo-3-dodecylthiophene.

28. The method of claim 27 wherein said soluble thiophene is mixed with methylmagnesium bromide in a dry solvent to yield said isomer intermediate.

29. The method of claim 28 wherein said Ni(II) catalyst is 1,3-diphenylphosphinopropane nickel(II) chloride and is added to said isomer intermediate to form a polymer having the structure:

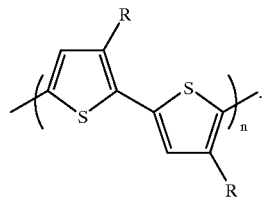

30. A method of forming a regioregular polymer, comprising:
combining a substituted thiophene having at least two leaving groups with an organomagnesium reagent, wherein said organomagnesium reagent has the formula R'MgX', to form a regiochemical isomer intermediate, said isomer intermediate having the structure:

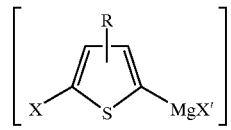

wherein R is one of an non-reactive and protected reactive substituent that is non-reactive with said organomagnesium reagent, X is a halogen, X' is a halogen, and R' is a substituent selected from the group consisting of alkyl, vinyl and phenyl; and adding an effective amount of Ni(II) catalyst to initiate a polymerization reaction.

31. The method of claim 30 wherein X is a halogen selected from the group consisting of Br and I.

32. The method of claim 30 wherein X' is Br.

33. The method of claim 30 wherein R and R' are each an alkyl group.

34. The method of claim 30 wherein R and R' are each an alkyl group and X and X' are each Br.

35. The method of claim 30 wherein said organomagnesium reagent is methylmagnesium bromide.

36. The method of claim 30 wherein said substituted thiophene is 2,5-dibromo-3-dodecylthiophene.

37. The method of claim 36 wherein said substituted thiophene is mixed with methylmagnesium bromide in a dry solvent to produce said isomer intermediate.

38. The method of claim 37 wherein said Ni(II) catalyst is 1,3-diphenylphosphinopropane nickel(II) chloride and is added to said isomer intermediate to form a polymer having the structure:

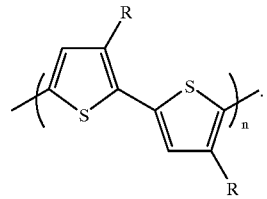

39. The method of claim 30 wherein said Ni(II) catalyst is one of 1,3-diphenylphosphinopropane nickel(II) chloride and 1,2-bis(diphenylphosphino)ethane nickel(II) chloride.

* * * * *

UNITED STATES PATENT AND TRADEMARK OFFICE
CERTIFICATE OF CORRECTION

PATENT NO. : 6,166,172
DATED : December 26, 2000
INVENTOR(S) : McCullough et al.

Page 1 of 1

It is certified that error appears in the above-identified patent and that said Letters Patent is hereby corrected as shown below:

Title page,
Insert -- A -- before "METHOD";

Column 1,
OTHER PUBLICATIONS,
Line 6, delete "*Snythetic*" and substitute therefor -- *Synthetic* --;
Line 21, delete "Descrition" and substitute therefor -- Description --;

Column 5,
Line 48, delete "$R^1$" and substitute therefor -- R' --;

Column 8,
Line 51, in the diagram, delete "+ R'X" and substitute therefor -- + R'Br --; and Column 9, claim 4,
Line 2, delete "methylnagnesium" and substitute therefor -- methylmagnesium --.

Signed and Sealed this

Fourth Day of December, 2001

Attest:

*Nicholas P. Godici*

NICHOLAS P. GODICI
*Attesting Officer*     *Acting Director of the United States Patent and Trademark Office*